United States Patent
Liaw

[11] Patent Number: 5,970,346
[45] Date of Patent: Oct. 19, 1999

[54] FUSE WINDOW GUARD RING STRUCTURE FOR NITRIDE CAPPED SELF ALIGNED CONTACT PROCESSES

[75] Inventor: Jhon-Jhy Liaw, Taipei, Taiwan

[73] Assignee: Taiwan Semiconductor Manufacturing Company, Ltd., Hsin-Chu, Taiwan

[21] Appl. No.: 08/933,370

[22] Filed: Sep. 19, 1997

[51] Int. Cl.[6] .................................................. H01L 21/336
[52] U.S. Cl. ..................... 438/281; 438/132; 438/215; 438/333; 438/601; 148/DIG. 55
[58] Field of Search ..................................... 438/132, 601, 438/215, 281, 333; 148/DIG. 55

[56] References Cited

U.S. PATENT DOCUMENTS

| | | | |
|---|---|---|---|
| 5,444,012 | 8/1995 | Yoshizumi et al. | 438/281 |
| 5,538,924 | 7/1996 | Chen | 438/132 |
| 5,567,643 | 10/1996 | Lee et al. | 438/601 |

*Primary Examiner*—Trung Dang
*Attorney, Agent, or Firm*—George O. Saile; Stephen B. Ackerman; William J. Stoffel

[57] ABSTRACT

The present invention provides a structure and method for forming a moisture barrier guard ring structure 38 44 48 52 54 for around a fuse window 30 in a semiconductor device. The invention begins by forming a fuse structure 32 33 34 over the isolation regions cross the fuse window area. A cap layer 38 and an interlevel dielectric layer (ILD) 40 are formed over the fuse structure. A first annular ring 44 (e.g., contact w-plug) is formed over the isolation region 20 surrounding the fuse window area 30 and over the fuse structure 32 33 34. A key feature is that the first annular ring 44 and the cap layer 38 form a moisture proof seal over the fuse structure. A first conductive wiring line 48 is formed over the first annular ring 44. Next, an inter metal dielectric (IMD) layer 50 is formed over the interlevel dielectric layer 40. A second annular ring 52 is formed through the inter metal dielectric layer 50 on the first conductive wiring line 48. A second conductive wiring line 54 is formed over the second annular ring 44. A passivation layer 60 64 is formed over the resulting surface and a fuse window 31 is etched through the passivation layer 60 64 and partially through the inter metal dielectric layer 50 over the fuse window area 30. The first annular ring 44, the first conductive wiring line 48, the second annular ring 52, the second conductive wiring line 54 comprise the invention's moisture proof guard ring structure surrounding the fuse window area.

15 Claims, 4 Drawing Sheets

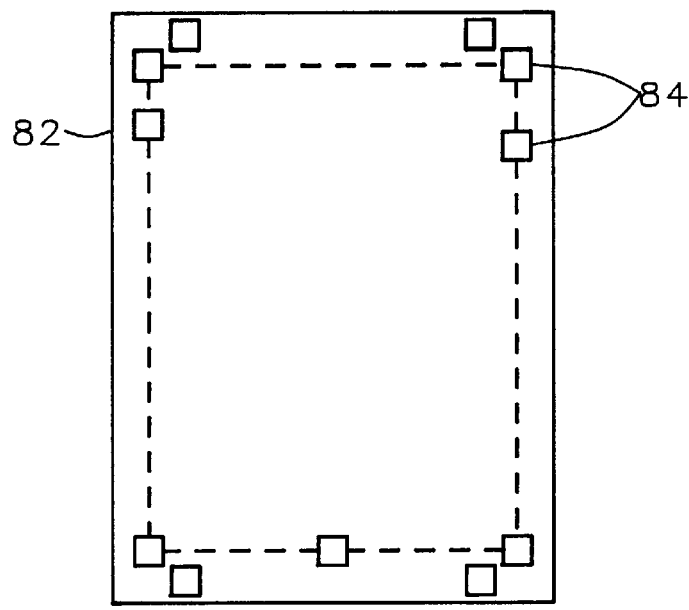
FIG. 1A – Prior Art
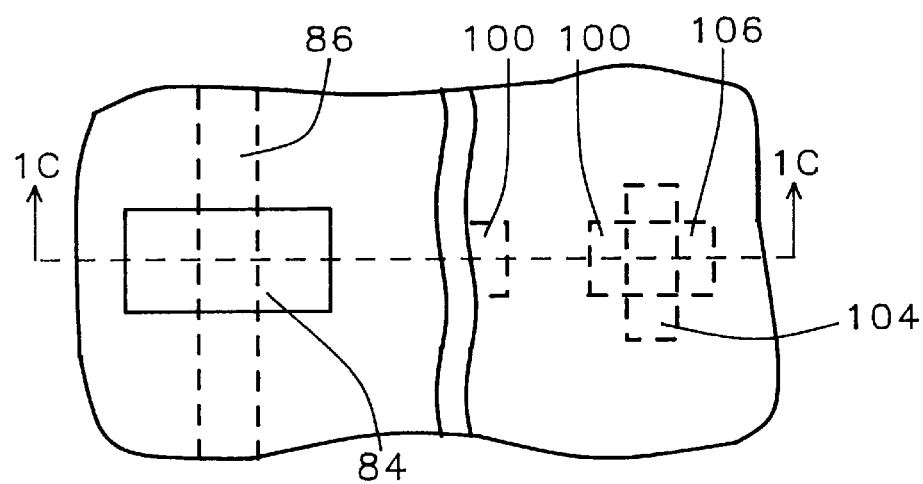
FIG. 1B – Prior Art

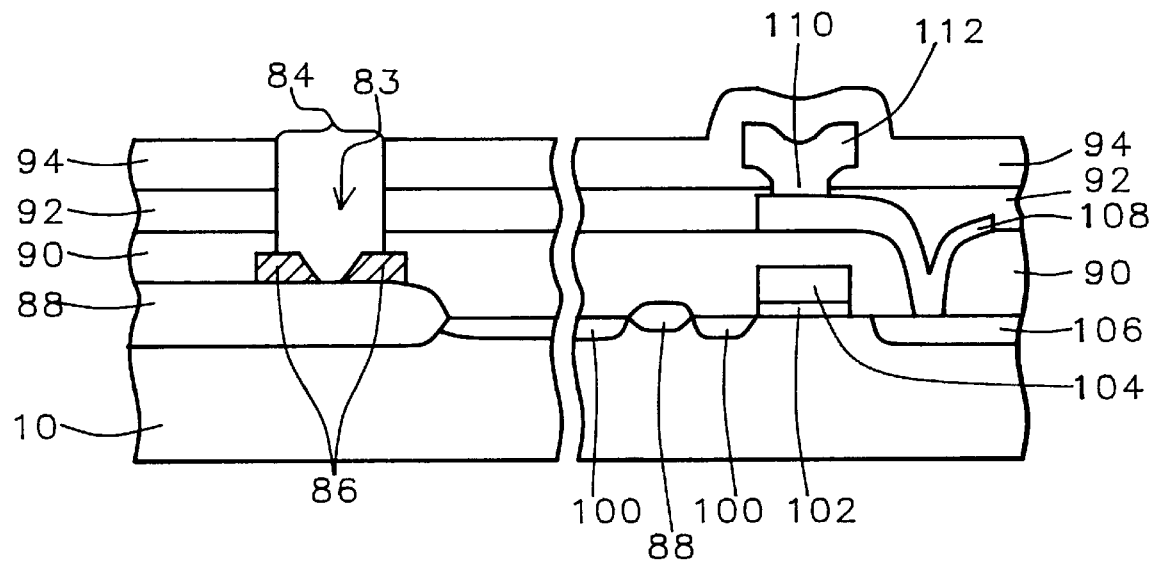
FIG. 1C – Prior Art
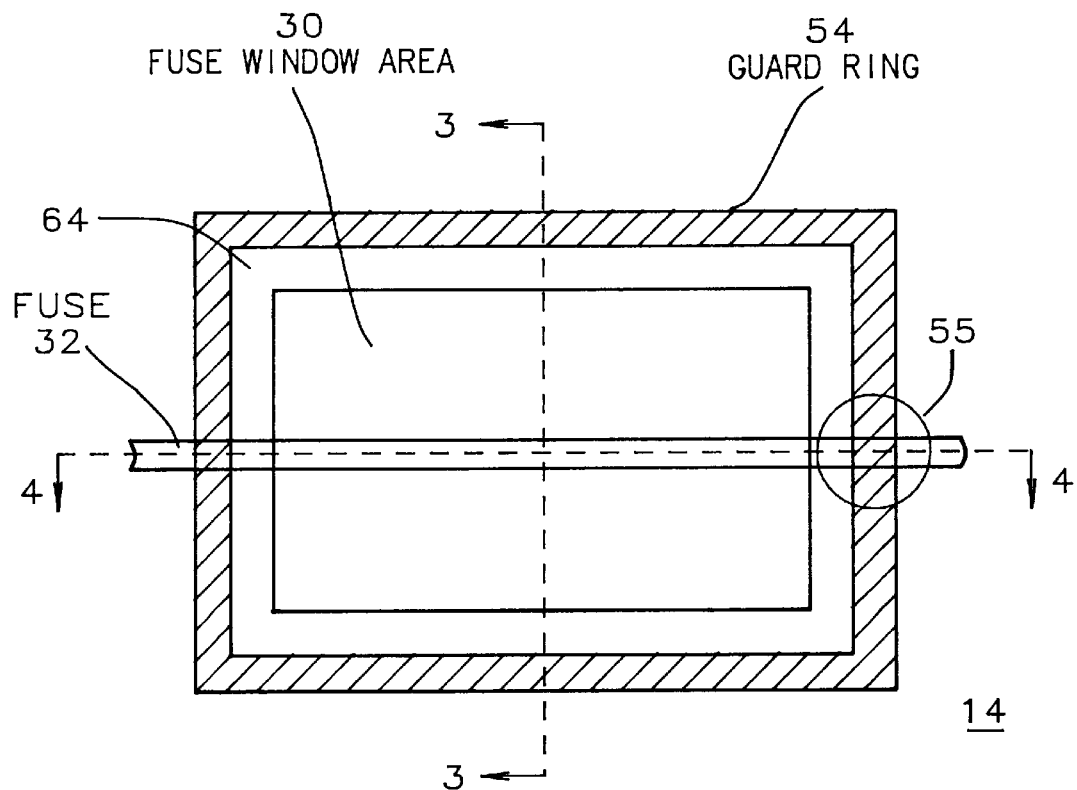
FIG. 2

FUSE WINDOW GUARD RING STRUCTURE FOR NITRIDE CAPPED SELF ALIGNED CONTACT PROCESSES

BACKGROUND OF INVENTION

1) Field of the Invention

This invention relates to integrated circuits and semiconductor devices. It relates particularly to a structure nd method for producing integrated circuits having moisture and contamination barrier layers surrounding openings in insulating layers, such as fuse openings.

2) Description of the Prior Art

Fuses can be used to rewire memory and logic circuits. For example, in dynamic or static memory chips, defective memory cells may be replaced by blowing fuses associated with the defective cells, and activating a spare row or column of cells. This circuit rewiring using fusible links allows considerable enhanced yields and reduces the production costs. Also, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

An important challenge is to improve the reliability and yields of the semiconductor devices surrounding openings in insulating layers, such as openings over fusible links. A problem with openings is that moisture and other contaminants can diffuse from the openings into the device areas thus reducing circuit reliability and yields.

FIG. 1A shows a top plan view of a semiconductor chip 82 with openings 84 through the insulating layers called fuse (cutting) openings 84. Also, a semiconductor chip 82 sometimes contains openings over alignment marks which are used to align the laser repair machine and other tools.

A conventional fusible link region and an adjacent device region are shown in a top down view in FIG. 1B. FIG. 1C shows a cross-sectional view of the same link and device regions taken along horizontal axis labeled 1C in FIG. 1B. Fuse 86 can be formed of a metal.

Fuse 86 is often formed over thick field oxide regions 88 in semiconductor substrate 10 as shown in FIG. 1c. Fuse 86 is formed over the field oxide regions 88 to prevent shorting of the fuse 86 to the substrate 10 through a thinner insulating layer. Layers 90, 92, 94, are insulating layers. Opening 84 is formed over the fuse area through the insulating layers 90, 92, 94. An adjacent semiconductor device is shown with buried doped regions 100 106, gate oxide 102, gate 104, via 110 and metal layers 108, 112. The fuse 86 is shown in FIG. 1c with a hole 83 formed after the fuse was "blown" (i.e., cut or heated) by a laser. Contamination can diffuse through the hole 83 into the field oxide layer 88 and then into the other insulating layers 90, 92, 94 to the devices 100, 102, 106.

There are two methods for blowing fuses: (a) using a laser and (b) passing a high current through the fuse. The portion of the fuse and thin insulating layer which is melted away or "blown" must not deposit or interfere with near-by devices.

A laser is often used to break the fuse forming an electrical open by heating the fuse to a high temperature. It is conventional to have an opening 84 over the fuse in the area where the fuse will be broken so that the laser heating will be more effective.

In addition, openings are often formed over alignment marks which are used to align the laser on the correct portion of the fuse to be blown. The alignment mark openings in the passivation layers are formed so that the alignment marks can be clearly viewed.

A major problem with any window opening in the passivation layers is that moisture and contamination can enter through the exposed insulation layers and diffuse to the semiconductor devices. The diffused moisture and contaminates can decrease reliability and yields. Moisture is present in the air and sodium (Na+ ions) is plentiful in the environment.

As shown in FIG. 1C, moisture and other contaminants can enter through the hole 83 into layer 88 and diffuse to the adjacent semiconductor devices. Water will attack the metal via 110, with the following reaction:

causing the resistance of metal via's 110 to increase and finally cause circuit failure. Mobile ions, such as sodium ions, can diffuse through insulating layers 90, 92, 94 and field oxide layer 88. Mobile ions in the field oxide layer 88 can also cause field inversion. The field inversion causes undesired leakage current between adjacent buried doped regions 100. Also, mobile ions in the gate oxide 102 will cause a transistor threshold shift whereby the circuit fails. Furthermore, moisture can cause the insulating layers to delaminate causing circuit failure.

The importance of overcoming the problems of moisture diffusing through fuse windows and the other various deficiencies noted above is evidenced by the extensive technological development directed to the subject, as documented by the relevant patent and technical literature. The closest and apparently more relevant technical developments in the patent literature can be gleaned by considering U.S. Pat. No. 5,567,643(Lee et al.) shows a method of forming a guard ring that uses two water impervious layers (1st and second metal layer 20 22) bonded to the silicon substrate. See FIG. 6. U.S. Pat. No. 5,538,924(Chen) shows a guard ring composed of 2 rings (layer 16 and metal layer and a SIN barrier layer. U.S. Pat. No. 5,444,012(Yoshizumi et al.) shows a guard ring composed of 3 layers—poly, M1 and M2. However, the M1 and M2 layers are not bonded to each other and therefore allow moisture to diffuse to the active devices. See Yoshizumi FIG. 34. Unfortunately, the problem of contaminants diffusing to the semiconductor devices through the fuse window still exists and an improved structure/method of forming a guard ring is still needed.

SUMMARY OF THE INVENTION

It is a general object of the invention to provide an improved structure and method for forming an integrated circuit moisture barrier which prevents contamination/moisture from diffusing from an opening (e.g., window) in insulating layers to device areas.

A more specific object of the present invention is to provide an improved structure and method for forming an integrated circuit moisture barrier which prevents moisture from diffusing through an opening in the insulating layers over a fuse to semiconductor devices.

In accordance with the above objects, a structure and technique for forming a moisture barrier guard ring structure for an integrated circuit on a substrate. The substrate has a fuse window area 30 and device areas 65. The invention comprises the steps of:

a) (See FIGS. 2, 3 and 4) forming an isolation region 20 over a substrate 10 having fuse window area 30 and product area 65; the isolation region 20 covering at least the fuse window area 30;

b) forming a fuse structure 32 33 34 over the isolation regions and across the fuse window area;

c) forming a cap layer 38 (e.g., SiN) over said substrate, said fuse structure 32 33 34 and said isolation region;

d) forming an interlevel dielectric layer (ILD) 40 over the fuse structure, isolation region 20; and the substrate 10 surface;

e) forming a first annular ring 44 (e.g., contact w-plug) over the isolation region 20 surrounding the fuse window area 30 and over the fuse structure 32 33 34; said first annular ring 44 forming a moisture proof seal with said cap layer 38 over said fuse structure 32 33 34; See FIG. 4, area 55;

f) forming a first conductive wiring line 48 over the first annular ring 44;

g) forming an inter metal dielectric (IMD) layer 50 over the interlevel dielectric layer (IDL) 40 and the first conductive wiring line 48;

h) forming a second annular ring 52 through the inter metal dielectric layer 50 on the first conductive wiring line 48;

i) forming a second conductive wiring line 54 over the second annular ring 44;

j) forming a passivation layer 60 64 over said inter metal dielectric layer 50 and said second conductive wiring layer 54; said passivation layer 60 64 comprised of a first oxide passivation layer 60 and a first silicon nitride passivation layer 64;

k) forming a fuse window 31 through the passivation layer 60 64 and partially through the inter metal dielectric layer 50 over the fuse window area 30 whereby the first annular ring, the first conductive wiring line 48, the second annular ring, the second conductive wiring line 54 comprise a moisture proof guard ring structure surrounding the fuse window area.

The guard ring structure of the present invention provides four barrier metal layers 54 52 48 44 that prevent moisture from diffusing from the fuse window 31 into surrounding product areas 14. The invention's guard ring structure 54 52 48 44 is formed of the same layers that are used to fabricate product devices and no additional process steps or layers are required. For example, the first annular ring 44 and the first level contacts (e.g., w-plug contact) of the product devices are both formed from the same metal deposition process.

The same self-alignment contact process (SAC) that forms the openings for the first level contacts (e.g., w-plug contact) of the product devices forms the openings for the first annular ring 44 around the fuse.

Another key feature of the invention is the nitride cap 33 33A over the fuse 32 and product gates 32*a*. See FIG. 5.

The invention has advantages over the prior art in the configuration of the 1st annular ring 44 where it crosses 55 over the fuse 33. See FIGS. 2 and 4. The 1st annular ring 44 forms a seal with the nitride layer 38 and the fuse 33 in area 55, unlike the prior art. The invention provides a cost-effective approach to preventing moisture from entering the fuse openings and from penetrating into device areas.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A is a top plan view in greatly enlarged scale that illustrates a semiconductor chip with openings in accordance with the prior art.

FIG. 1B is a top plan view in greatly enlarged scale that illustrates an opening for a fuse and adjacent devices in accordance with the prior art.

FIG. 1C is a cross sectional view along axis 1C in FIG. 1B showing a fuse opening, a fuse, and adjacent devices in accordance with the prior art.

FIG. 2 is a top down view of the fuse window area 30 and the guard ring structure 54 52 48 44 of the present invention.

FIG. 4 shows the cross section view of area 55 shown in top plan view 2.

DETAILED DESCRIPTION OF THE PREFERRED EMBODIMENTS

Figure 3:
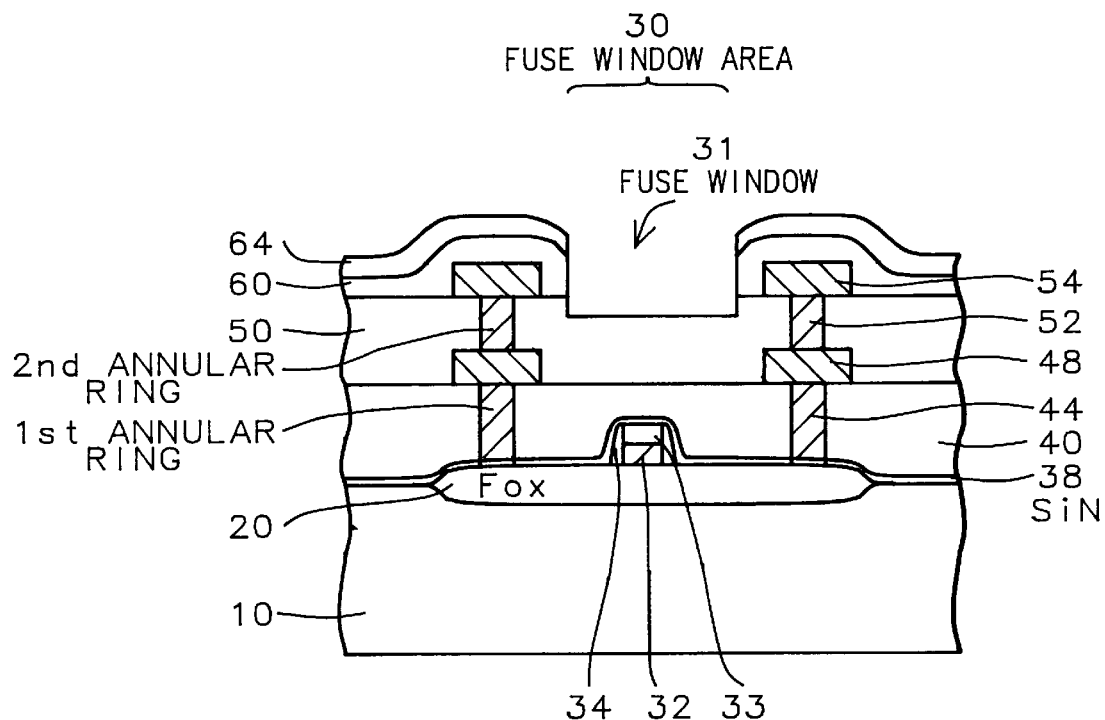
FIG. 3 is a cross sectional view along the axis 3 in FIG. 2 showing the guard ring structure 54 52 48 44 of the present invention.
Figure 4:
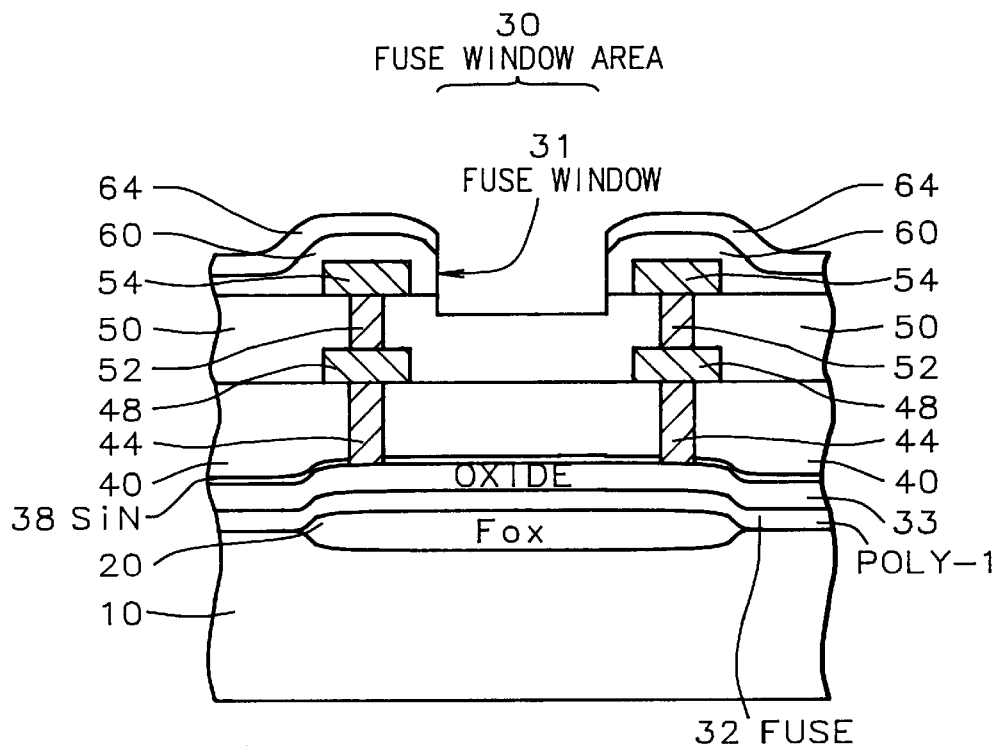
FIG. 4 is a cross sectional view along the axis 4 in FIG. 2 showing the guard ring structure 54 52 48 44 of the present invention.
Figure 5:
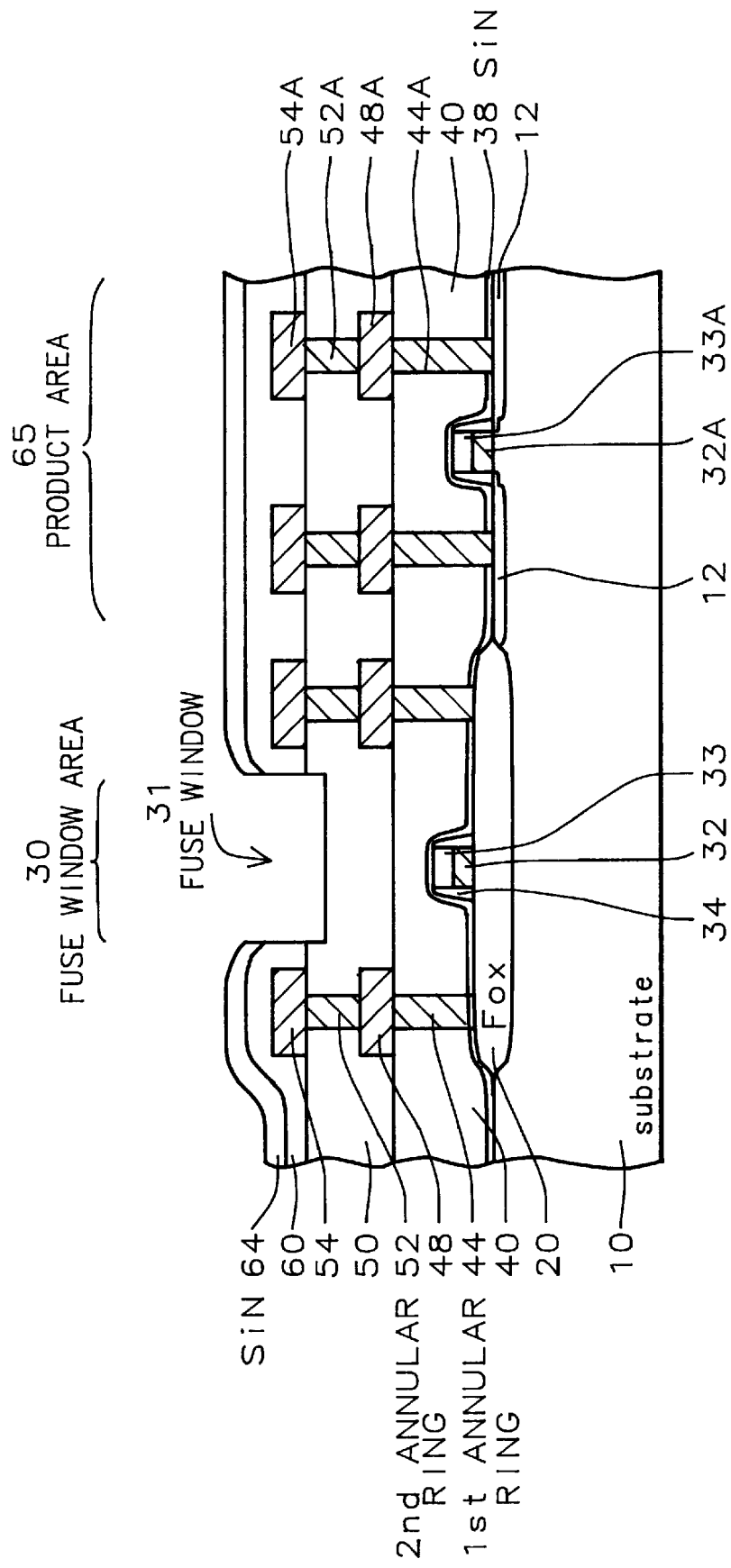
FIG. 5 is a cross sectional view along the axis 3 in FIG. 2 showing simultaneous fabrication of the guard ring structure 54 52 48 44 and product devices in the device areas of the present invention.

The present invention will be described in detail with reference to the accompanying drawings. The invention is a structure and method of forming the moisture barrier guard ring structure for an integrated circuit on a substrate. FIG. 2 shows a top down view of the fuse window area 30 showing the fuse 32 and the guard ring 54 52 48 44. FIG. 2, Area 55 and FIG. 4 show an improvement over the prior art. FIG. 4 shows the ring 44 sealed with the nitride cap layer 38. The FIG. 3 shows a cross sectional view along the axis 3 in FIG. 2. FIG. 4 shows cross sectional view along the axis 4 in FIG. 2. The FIGS. 2, 3, 4, and 5 show that the invention's guard ring structure 54 52 48 44 that surrounds the fuse window 31 and forms a moisture proof seal with the substrate/isolation region 20. The guard ring structure prevents moisture and contamination from diffusing from the fuse window 31 to the product devices in the surrounding active areas 14. FIG. 5 shows the simultaneous formation of the guard ring and the produce devices in the device areas 65. The metal layers 44 48 52 54 of the guard ring and the metal layers 44A 48A 52A 54A of the product devices are formed with the same processes.

As shown in FIGS. 2, 3 and 4, an isolation region 20 (e.g. field oxide, FOX) is formed over a substrate 10 having fuse window area. The isolation region 20 covers at least the fuse window area 30.

A substrate 10 is provided having a fuse window area 63 and device areas 65. The fuse window area overlays a portion of the field oxide. The device areas 65 are the non-isolation areas of the substrate 10 where product devices are simultaneously formed along with the guard ring structure 44 48 52 54.

Substrate is understood to possibly include a semiconductor wafer, active and passive devices formed within the wafer and layers formed on and over the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

Next, a fuse structure 32 33 34 is formed over the isolation regions and across the fuse window area. The conductive fuse structure 32 33 34 is preferably formed by forming a polysilicon fuse 32 and a fuse dielectric layer 33 (e.g., fuse oxide layer, top fuse dielectric layer) over the isolation region 20. Next, sidewall spacers are formed on the sidewalls of the polysilicon fuse 32 and the fuse dielectric layer 33. Other fuse structures with different layers and configurations are possible as known to those skilled in the art.

Source and drain regions 12 are then formed in the product areas 65.

Next, a cap dielectric layer 38 (cap nitride layer) is formed over the fuse 32 33 34 and the isolation region. The capped dielectric layer 38 is preferably composed of a moisture proof layer such as silicon nitride, LVCVD nitride or silicon-oxy-nitride and is most preferably composed of silicon nitride. The cap layer 38 is a key feature of the invention as shown in FIG. 2 (area 55) and FIG. 4. The cap nitride layer 38 forms a moisture proof seal with the first annular ring over the fuse structure 32 33 34. See FIG. 2, area 55. The first annular ring 44 forms a seal with the nitride layer 38 and the fuse 33 in area 55, unlike the prior art. See U.S. Pat. No. 5,567,643(Lee et al.) FIGS. 5 and 7. Lee forms the guard ring 20 22 over the insulating layer 14 which can allow moisture to leak under the ring 20. In contrast, the cap layer 38 of the present invention forms a seal with the 1st annular ring 44 to prevent moisture from seeping through the fuse dielectric layer 33.

Next, an interlevel dielectric layer (ILD) 40 is formed over the fuse 32, isolation region 20, and the substrate 10 surface. The interlevel dielectric layer (ILD) 40 is preferably composed of borophosphosilicate glass (BPSG), BPTEOS, PETEOS and is more preferably composed of BPSG. The IDL layer 40 is preferably composed of an undoped PETEOS layer (preferably thickness between about 1 and 2 kÅ)+a BPTEOS layer (preferably thickness in a range of between about 3 and 12 kÅ). The ILD layer 40 preferably has a thickness in a range of between about 4000 and 11,000 Å.

First annular ring and contact (Self align contact) openings are formed through the ILD layer and the cap layer 38 are formed using a photolithographic (mask, expose, develop, & etch process) process. The openings define the contact areas in the product area 65 and the area where the 1st annular ring will be formed. The openings in the product areas are preferably self aligned contact (SAC) openings.

A metal layer is formed over the resultant surface in the openings forming self-aligned contacts 44A in the product areas. Also, a first annular ring 44 is formed (e.g., contact w-plug) over the isolation region 20 surrounding the fuse window area 30 and over the fuse structure 32 33 34.

The first annular ring 44 is preferably composed of Al, Al alloy, tungsten, titanium, tungsten alloy, titanium alloy, polysilicon or polycides, and is most preferably composed of tungsten. A preferred configuration of the first annular ring and contacts 44A is a Ti/TiN/W plug structure. FIG. 4 shows the important moisture proof seal the first annular rings 44 forms with the cap layer 38 over the fuse in area 55. See FIG. 2.

A first conductive wiring line 48 is formed over the first annular ring 44. The first conductive wiring line 48 is preferably composed of Al, Al alloy, AlCu alloy, tungsten, or TiN and is most preferably an AlCu alloy. The first conductive wiring line preferably has a thickness in a range of between about 1000 and 6000 Å. FIG. 5 shows the first conductive line 48A simultaneously formed in the product area 65.

An inter metal dielectric (IMD) layer 50 is formed over the interlevel dielectric layer 40 and the first conductive wiring line 48.

The inter metal dielectric (IMD) layer 50 is preferably composed of borophosphosilicate glass (BPSG), phosphosilicate glass (PSG), PEOX, or PETEOS and most preferably composed of PEOX/O3TEOS. The inter metal dielectric (IMD) layer 50 has a thickness in a range of between about 3000 and 11,000 Å.

Next, openings are formed through the IMD layer 50 for the second annular rings 52 and the second device contact layer 52A (in the product areas).

A second annular ring 52 is formed through the inter metal dielectric layer 50 on the first conductive wiring line 48. The second annular ring 52 is preferably composed of Al, AlCu, tungsten (W), and TiN and is most preferably composed of tungsten. The second annular ring 52 preferably has a thickness in a range of between about 3000 and 11,000 Å.

A second conductive wiring line 54 is formed over the second annular ring 44. The second conductive wiring line 54 is preferably composed of Al, Al alloys, AlCu, TiN and most preferably composed of AlCu. The second conductive line preferably has a thickness in a range of between about 2000 and 8000 Å.

Next, a passivation layer 60 64 is formed over the inter metal layer 50. The passivation layer can be comprised of a two layer structure such as a first oxide passivation layer 60 and a first silicon nitride passivation layer 64.

FIG. 5 shows one preferred configuration of the fuse window 31. A fuse window 31 is preferably formed through the passivation layer 60 64 and partially through the inter metal dielectric layer 50 over the fuse window area 30. The fuse window 31 preferably has a depth from the passivation layer 64 top surface in a range of between about 3000 and 15,000 Å. The fuse window can be formed through more or less portions of the layers 40 50 60 64 overlying the fuse. For example, the fuse window may be formed exposing the cap layer 38 or only through the SiN layer 64. Other configurations are possible.

The invention's moisture proof guard ring structure that surrounds the fuse window area is made up of: the first annular ring 44, the first conductive wiring line 48, the second annular ring 52; and the second conductive wiring line 54.

The invention's guard ring structure 54 52 48 44 formed of the same layers that are used to fabricate product devices and no additional steps are required. For example, the first annular ring 44 is formed in the same processes that form the first level contacts (e.g., SAC, w-plug contact) of the product devices. FIG. 5 shows a cross sectional view of invention's guard ring and product structures.

As shown in FIG. 5, the fuse structure 32 33 34 and a gate structure are simultaneously formed over the device area; and forming doped regions in the substrate adjacent to the gate structures.

The interlevel dielectric layer (ILD) 40 is formed over the fuse and the gate structure.

The first annular ring 44 (e.g., contact w-plug layer) and first metal contacts 44A to the doped regions 12 over the device region 65 are simultaneously formed.

The first conductive wiring line 48 and a device first conductive layer 48A are simultaneous formed over the over first metal contacts 44A.

The inter metal dielectric (IMD) layer 50 is simultaneously formed over the interlevel dielectric layer 40, the 48 first conductive wiring line 48 and the device first conductive layer 48A.

The second annular ring 52 and a second device contact layer 52A are simultaneously formed through the inter metal dielectric layer 50 on the first device conductive wiring line 48A.

The second conductive wiring line 54 and a second device conductive wiring line 54A are simultaneously formed over the second device contact layer 44A.

The passivation layer 60 64 is formed over the second conductive wiring line 54 and the second conductive wiring line 54A and the inter metal dielectric layer 50.

Brief Flow Chart of the Process

Below is a brief process flow table of the improved process of the invention:

--- define active regions
shallow trench isolation or LOCOS 30
deposit gate material 32 32A (polysilicon or polycide/polysilicon)
deposit oxide (PETEOS or LPTEOS 1000–2500 A) 33 33A
define gate areas
N LDD & P LDD implant
form spacer (deposit oxide & etch-back)
Source /Drain 12 implant (N+ & P+)
deposit $Si_3N_4$ cap layer 38
ILD layer 40 deposition (undoped PETEOS (1–2 kA) + BPTEOS( 3–12 kA))
BPTEOS flow (750° C.–900° C.)
IDL layer 40 etch-back
define SAC areas (include fuse window)
SAC etch (define openings) (etch oxide & stop on SL3N4)
remove Si3N4 layers 38
Barrier metal deposition 44 44a (Ti/TiN/W plug)
W plug etch-back
define Metal- I 48 48A , via 52 52A, Metal-2 54 54A and passivation areas (include sputter, photo and etch)

---

Structure of the Invention

The invention further provides a novel guard ring structure which can be fabricated by the method described above. As shown in FIG. 5, a moisture barrier guard ring structure for an integrated circuit on a substrate. The substrate has a fuse window area 63 and device areas 65. The moisture barrier guard ring structure comprises:

a) an isolation region 20 over a substrate 10 having fuse window area 30; the isolation region 20 covering at least the fuse window area 30;

b) a fuse structure 32 33 34 over the isolation regions cross the fuse window area;

c) a cap layer 38 over said fuse structure, said isolation regions, and said substrate; the cap layer formed of a moisture proof material;

d) an interlevel dielectric layer (ILD) 40 over the fuse, isolation region 20, cap layer and the substrate 10 surface;

e) a first annular ring 44 (e.g., contact w-plug) over the isolation region 20 surrounding the fuse window area 30 and over the fuse structure 32 33 34; said first annular ring 44 and said cap layer forming a moisture proof seal over 55 said fuse structure;(see FIG. 4)

f) a first conductive wiring line 48 over the first annular ring 44;

g) an inter metal dielectric (IMD) layer 50 over the interlevel dielectric layer 40 and the first conductive wiring line 48;

h) a second annular ring 52 through the inter metal dielectric layer 50 on the first conductive wiring line 48 and over the inter metal dielectric (IMD) layer 50;

i) a second conductive wiring line 54 over the second annular ring 44;

j) a passivation layer 60 64 comprised of a first oxide passivation layer 60 and a first silicon nitride passivation layer 64 over the second conductive wiring line 54 and the inter metal dielectric layer 50;

k) a fuse window 31 through the passivation layer 60 64 and partially through the inter metal dielectric layer 50 over the fuse window area 30.

The moisture proof guard ring structure is comprised of the first annular ring, the first conductive wiring line 48, the second annular ring; the second conductive wiring line 54; the moisture proof guard ring structure surrounding the fuse window area. The guard ring is formed as described above. Also, the guard ring and comparable product metal layers 44A 48A 52A 54A exist on the same product wafer.

Advantages of the Invention

The guard ring structure of the present invention provides four barrier layers 54 52 48 44 that prevent moisture from diffusing from the fuse window 31 into surrounding product areas 65. The invention's guard ring structure 54 52 48 44 formed of the same layers that are used to fabricate product devices and no additional steps are required. For example, the first annular ring 44 is formed in the same processes that form the first level contacts (e.g., w-plug contact) of the product devices.

The same self-alignment contact process (SAC) that forms the openings for the first level contacts (e.g., w-plug contact) of the product devices forms the openings for the first annular ring 44 around the fuse. Another key feature of the invention is the nitride cap 33 33A over the fuse 32 and product gates 32a. See FIG. 5.

The invention provides a cost-effective approach to preventing moisture from entering the fuse openings and from penetrating into device areas. The invention has advantages over the prior art in the configuration of the 1st annular ring 44 where it crosses 55 over the fuse 33. See FIGS. 2 and 4. The 1st annular ring 44 forms a seal with the nitride layer 38 and the fuse 33 in area 55, unlike the prior art. See U.S. Pat. No. 5,567,643(Lee et al.) (FIGS. 5 and 7). Lee forms the guard ring over the insulating layer 14 which allows moisture to leak under the ring 20.

While the invention has been particularly shown and described with reference to the preferred embodiments thereof, it will be understood by those skilled in the art that various changes in form and details may be made without departing from the spirit and scope of the invention.

What is claimed is:

1. A method of forming a moisture barrier guard ring structure for an integrated circuit on a substrate; said substrate having a fuse window area and device areas; comprising the steps of:

a) forming an isolation region over a substrate having fuse window area; said isolation region covering at least said fuse window area;

b) forming a fuse structure over said isolation regions and across said fuse window area;

c) forming an interlevel dielectric layer over said fuse, isolation region, and said substrate surface;

d) forming a first annular ring over said isolation region surrounding said fuse window area and over said fuse structure;

e) forming a first conductive wiring line over said first annular ring;

f) forming an inter metal dielectric layer over said interlevel dielectric layer and said first conductive wiring line;

g) forming a second annular ring through said inter metal dielectric layer on said first conductive wiring line;

h) forming a second conductive wiring line over said second annular ring;

i) forming a passivation layer over said second conductive wiring line and said inter metal dielectric layer;

j) forming a fuse window through said passivation layer and partially through said inter metal dielectric layer over said fuse window area whereby a moisture proof guard ring structure is comprised of said first annular ring, said first conductive wiring line, said second annular ring; said second conductive wiring line; said moisture proof guard ring structure surrounding said fuse window area.

2. The method of claim 1 which further includes after step (b) forming a cap layer 38 over said substrate, said fuse structure and said isolation region; and step (d) further includes said first annular ring and said cap layer forming a moisture proof seal over said fuse structure.

3. The method of claim 1 wherein said fuse structure formed by forming a polysilicon fuse and a fuse dielectric layer over said isolation region; forming sidewall spacers on the sidewalls of said polysilicon fuse and said fuse dielectric layer.

4. The method of claim 1 which further includes after step (b) forming a cap layer composed of silicon nitride over said fuse, and said isolation region.

5. The method of claim 1 wherein said interlevel dielectric layer is composed of a BPTEOS layer and a PETEOS layer and has a total thickness in a range of between about 4000 and 11,000 Å.

6. The method of claim 1 wherein said first annular ring is composed of a material selected from the group consisting of Al, Al alloy, tungsten, titanium, tungsten alloy, titanium alloy, polysilicon and polycides, and tungsten.

7. The method of claim 1 wherein said first conductive wiring line is composed of a material selected from the group consisting of Al, Al alloy, W, TiW, and AlCu and said first conductive wiring line has a thickness in a range of between about 1000 and 6000 Å.

8. The method of claim 1 wherein said inter metal dielectric layer composed of a material selected from the group consisting of PEOX, PETEOS, O3TEOS borophosphosilicate glass, and phosphosilicate glass, and said inter metal dielectric (IMD) layer has a thickness in a range of between about 3000 and 11,000 Å.

9. The method of claim 1 wherein said second annular ring is composed of a material selected from the group consisting of Al, AlCu, and Tungsten, and said second annular ring has a thickness in a range of between about 3000 and 11,000 Å.

10. The method of claim 1 wherein said second conductive wiring line is composed of a material selected from the group consisting of Al, TiN, and AlCu; and said second conductive line thickness in a range of between about 2000 and 8000 Å.

11. The method of claim 1 wherein said fuse window having a depth from the passivation layer surface in a range of between about 3000 and 15,000 Å.

12. The method of claim 1 wherein said passivation layer is comprised of a first oxide passivation layer and a first silicon nitride passivation layer.

13. The method of claim 1 which further includes:

a) simultaneously forming said fuse structure and a gate structure over said device area; and forming doped regions in said substrate adjacent to said gate structures;

b) forming said interlevel dielectric layer over said fuse and said gate structure;

c) simultaneously forming said first annular ring and first metal contacts to said doped regions over said device region;

d) simultaneous forming said first conductive wiring line and a device first conductive layer over said over first metal contacts;

e) forming an inter metal dielectric layer over said interlevel dielectric layer, said first conductive wiring line and said device first conductive layer;

f) simultaneously forming said second annular ring and a second device contact layer through said inter metal dielectric layer on said first device conductive wiring line;

g) simultaneously forming said second conductive wiring line and a second device conductive wiring line over said second device contact layer;

h) forming said passivation layer over said second conductive wiring line and said second conductive wiring line and said inter metal dielectric layer.

14. A method of forming a moisture barrier guard ring structure for an integrated circuit on a substrate; said substrate having a fuse window area and device areas; comprising the steps of:

a) forming an isolation region over a substrate having fuse window area; said isolation region covering at least said fuse window area;

b) forming a fuse structure over said isolation regions cross said fuse window area; said fuse structure formed by forming a polysilicon fuse and a fuse dielectric layer over said isolation region; forming sidewall spacers on the sidewalls of said polysilicon fuse and said fuse dielectric layer;

c) forming a cap layer composed of silicon nitride over said fuse, said isolation region and said substrate;

d) forming an interlevel dielectric layer over said fuse, said isolation region, said cap layer, and said substrate surface; said interlevel dielectric layer is composed of BPTEOS/PETEOS and preferably having a thickness in a range of between about 4000 and 11,000 Å;

e) forming a first annular ring over said isolation region surrounding said fuse window area and over said fuse structure; said first annular ring forming a moisture proof seal with said cap layer over said fuse structure;

f) forming a first conductive wiring line over said first annular ring;said first conductive wiring line composed of a material selected from the group consisting of Al, Al alloy, W, TiW, and AlCu and said first conductive wiring line has a thickness in a range of between about 1000 and 6000 Å;

g) forming an inter metal dielectric layer over said interlevel dielectric layer and said first conductive wiring line; said inter metal dielectric layer composed of a material selected from the group consisting of PEOX, PETEOS, O3TEOS BPSG, and PSG, and said inter metal dielectric layer having a thickness in a range of between about 3000 and 11,000 Å;

h) forming a second annular ring through said inter metal dielectric layer on said first conductive wiring line; said second annular ring is composed of a material selected from the group consisting of Al, AlCu, and Tungsten, and said second annular ring has a thickness in a range of between about 3000 and 11,000 Å;

i) forming a second conductive wiring line over said second annular ring; said second conductive wiring line composed of a material selected from the group consisting of Al, TiN, and AlCu; and said second conductive line thickness in a range of between about 2000 and 8000 Å;

j) forming a passivation layer comprised of a first oxide passivation layer and a first silicon nitride passivation layer over said second conductive wiring line and said inter metal dielectric layer;

k) forming a fuse window through said passivation layer and partially through said inter metal dielectric layer over said fuse window area whereby a moisture proof guard ring structure is comprised of said first annular ring, said first conductive wiring line, said second annular ring; said second conductive wiring line; said moisture proof guard ring structure surrounding said fuse window area; said fuse window having a depth from the passivation layer surface in a range of between about 3000 and 15,000 Å.

15. The method of claim 14 which further includes:

a) simultaneously forming said fuse structure and a gate structure over said device area; and forming doped regions in said substrate adjacent to said gate structures;

b) forming said interlevel dielectric layer over said fuse and said gate structure;

c) simultaneously forming said first annular ring and first metal contacts to said doped regions over said device region;

d) simultaneous forming said first conductive wiring line and a device first conductive layerA over said over first metal contacts;

e) forming an inter metal dielectric layer over said interlevel dielectric layer, said first conductive wiring line and said device first conductive layer;

f) simultaneously forming said second annular ring and a second device contact layer through said inter metal dielectric layer on said first device conductive wiring line;

g) simultaneously forming said second conductive wiring line and a second device conductive wiring line over said second device contact layer;

h) forming said passivation layer over said second conductive wiring line and said second conductive wiring line and said inter metal dielectric layer.

* * * * *